United States Patent [19]

Perry et al.

[11] Patent Number: 4,978,911
[45] Date of Patent: Dec. 18, 1990

[54] ELECTRICAL ENERGY ANALYZER

[75] Inventors: Phillip J. Perry; John A. D. Meldrum; Jordon Metlikovec; Michael J. Bauer; Clive S. White, all of Heidelberg West, Australia

[73] Assignee: Oliver J. Nilsen (Australia) Limited, Victoria, Australia

[21] Appl. No.: 325,034

[22] Filed: Feb. 23, 1989

Related U.S. Application Data

[63] Continuation of Ser. No. 10,594, Feb. 3, 1987, abandoned.

[30] Foreign Application Priority Data

Feb. 6, 1986 [AU] Australia .................... PH04478

[51] Int. Cl.$^5$ .................. G01R 21/133; H02J 3/14; H03M 1/20
[52] U.S. Cl. .................. 324/142; 324/116; 341/131; 364/483; 364/493
[58] Field of Search ............ 324/142, 116; 364/483, 364/492, 493; 341/131

[56] References Cited

U.S. PATENT DOCUMENTS

| | | | |
|---|---|---|---|
| 3,656,152 | 4/1972 | Gundersen | 340/347 |
| 3,877,022 | 4/1975 | Lehman et al. | 340/347 AD |
| 4,077,061 | 2/1978 | Johnston et al. | 364/483 |
| 4,183,016 | 1/1980 | Sawagata | 340/347 |
| 4,317,175 | 2/1982 | Sterling et al. | 364/464 |
| 4,398,179 | 8/1983 | Kaneko | 340/347 |
| 4,447,803 | 5/1984 | Crosby et al. | 340/347 |
| 4,511,979 | 4/1985 | Amirante | 364/481 |

FOREIGN PATENT DOCUMENTS

WO83/03011 9/1983 European Pat. Off.

OTHER PUBLICATIONS

Federal Scientific Corp., "Dithering Increases Dynamic Range and Improves Linearity", FSC-L-569/100, Aug. 24, 1973.

IEEE Trans. on Instrum. and Meas., Turgel, "Digital Wattmeter Using a Sampling Method", vol. IM-23, No. 4, Dec. 1974, pp. 337-341.

Primary Examiner—Jerry Smith
Assistant Examiner—Stephen M. Baker
Attorney, Agent, or Firm—Griffin, Branigan & Butler

[57] ABSTRACT

An electrical energy analyzer including a computer for monitoring energy consumption and supporting ripple control is provided with improved A/D converter resolution by applying a ½ LSB square wave offset signal to the non-inverting input of a differential amplifier for amplifying a current shunt voltage. The amplifier output has limited filtering to allow a ½ to 1 LSB random signal to be applied to the measurement signal entering the A/D converter.

5 Claims, 10 Drawing Sheets

FIG. 7

ELECTRICAL ENERGY ANALYZER

This is a continuation of application Ser. No. 010,594, filed Feb. 3, 1987, abandoned.

The present invention relates to improvements in devices used for monitoring the use of electrical energy.

The use of general purpose watthour meters is well established with the state or local electricity authorities fitting such meters to the premises of each consumer. These meters are usually of the electro-mechanical "Ferraris disc" type and their operation and construction are well known. It is common, where an electric hot water service is provided, to have two such meters and a timer or ripple control unit to control operation of the hot water service or other equipment at the cheaper "off-peak rate". It is sometimes necessary to also include a by-pass switch to allow heating of water at the "day" rate when the hot water has been exhausted. These meters, timers, ripple control units and switches take up a considerable amount of room and can be rather expensive.

Accordingly it is an object of the present invention to provide an electronic electricity management system which incorporates an electrical energy analyzer (hereafter called analyzer), which has very few mechanical parts.

A further object of the invention is to provide an electronic analyzer which integrates the features of dual meters, by-pass switch and timer or ripple control unit into one compact unit.

With these objects in view the present invention in a first aspect may provide an analyzer including at least one current sensing means, a voltage sensing means, at least one analog to digital converter for digitizing sensed voltage and current values, computing means for constantly monitoring electrical energy consumption based on said digitized current and voltage values, data storage means for holding calculated and other required data, and display means for displaying selected data.

Preferably said analyzer includes two current sensing means for monitoring two separate electricity lines, one of said electricity lines being switched by said computing means. In one preferred embodiment said computing means may be coupled to a real time clock with said computing means switching said one line dependent on the time of day or else upon ripple control command. If required said analyzer may include a plurality of registers within said storage means for storing the energy consumed within a plurality of time of day zones.

A second aspect of the invention may provide a method of measuring electricity energy consumption, said method including the steps of sampling voltage and current values at a constant frequency, evaluating instantaneous power values based on said voltage and current samples and obtaining energy consumed by summing said evaluated samples.

Preferably the summed power samples are compared with a constant each time a summation is performed, a register is incremented each time said constant is exceeded with the constant being subtracted from the sum.

A third aspect of the invention may provide a method of enhancing the resolution of an analog to digital converter, said method including the step of allowing a random signal to be applied to the measurement signal entering said analog to digital converter.

Preferably said random signal is achieved by limiting the amount of filtering received by said measurement signal. In one preferred embodiment the measurement signal is left with $\frac{1}{2}$ to 1 LSB of superimposed random noise.

A fourth aspect of the invention may provide a method of enhancing the resolution of an analog to digital converter, said method including the step of pulsing a signal to be measured by said analog to digital converter with a predetermined offset.

Preferably said offset is limited to $\frac{1}{2}$ LSB.

In a preferred embodiment said signal has both said offset and said random noise applied thereto.

A fifth aspect of the invention may provide an electrical contactor including a moving arm contact, a stationary contact, a switchable coil for causing movement of said contacts into and out of contact and an arm or plate means mounted adjacent the arm of said moving arm contact, said arm or plate means being coupled to one of said contacts so that current flowing in said arm or plate means is in a direction opposite to that in said arm of said moving arm contact to prevent said contacts from being forced apart while closed.

Preferably said arm or plate means is mounted parallel to said arm of said moving arm contact.

Other aspects and features of this invention will become apparent from the following description of one non-limitative preferred embodiment thereof. Reference will be made in the description to the accompanying drawings, in which:

FIGS. 2, 2.1, 2.2, 2.3, 2.4 and 2.5 are sections of an electronic circuit schematic drawing of the analyzer shown in FIG. 1;

Figure 1:
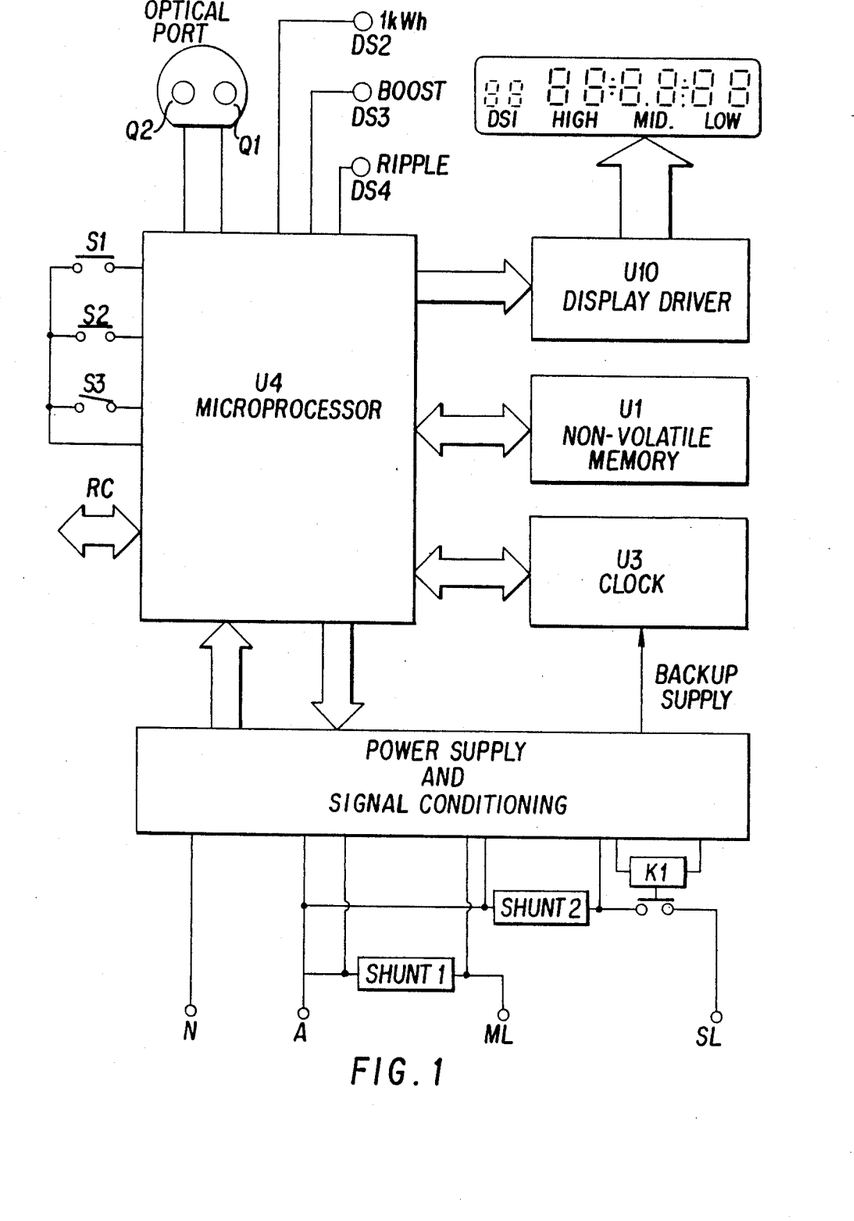
FIG. 1 is a block diagram of an analyzer made in accordance with the invention.

Turning to FIGS. 1 and 2 there is shown an electronic analyzer which performs the functions of two conventional meters, a time clock and a by-pass switch. The analyzer can also perform "time-of-use" metering. The embodiment is for use with single phase only and has a switched line for storage heating. The circuit operation will now be described in the following sections:

1. Power Supply

The power supply utilizes well known linear regulation techniques. Incoming mains A,N is filtered by resistor R75 and capacitor C41. Voltage spikes are suppressed by varistor VR6. The mains power transformer steps down the mains supply voltage to one winding of 10 V RMS and another of 20 V RMS. The 10 V winding is rectified, filtered and regulated to 5 V for the logic supply. The 20 V winding is rectified, filtered and regulated (by Zener diodes VR8 and VR7) to +10 V and −4.7 V respectively. This is used to power the operational amplifiers to be described below.

The Reference for the A/D converter, integral with microcomputer unit U4, is taken from the digital supply rail and suitably temperature compensated by resistors R71 and R72 and diode D34.

2. Current Input Amplifiers

The currents flowing in the main and switched circuits flow through two shunts (SHUNT 1 and 2). The voltages developed across the shunts are amplified by differential amplifiers (U5). There are three amplifiers—one (C) for the switched circuit (SL) and two for the main circuit (ML); one (A) for high currents and one (B) for low currents. Two ranges are required in order to expand the microcomputer's Analog to Digital dynamic range. After amplification, the signals are capacitively coupled into analog switches (U7), the inputs of which have been impressed with a DC bias. The analog switches (U7) are scanned at sample time by port PB1 via level shifter/amplifier U6, of microcomputer (U4). Each signal is passed to a separate A/D input of microcomputer (U4) where it is digitized.

Resolution of the A/D is improved by the use of noise and offset jitter or shifting. The randomization of the signal is achieved by limiting the amount of filtering that the amplified signal is subjected to. Thus the current signal is left with about ½ to 1 LSB of superimposed random noise. Offset shifting is implemented by the circuitry comprising operational amplifier D and switch U7. This circuit merely takes a square wave and uses it to switch the non-inverting level of the amplifiers (comprised of A, B, C) from V RH/2 to ½ LSB less than V RH/2 using level shifter/amplifier U5D.

Figure 3:
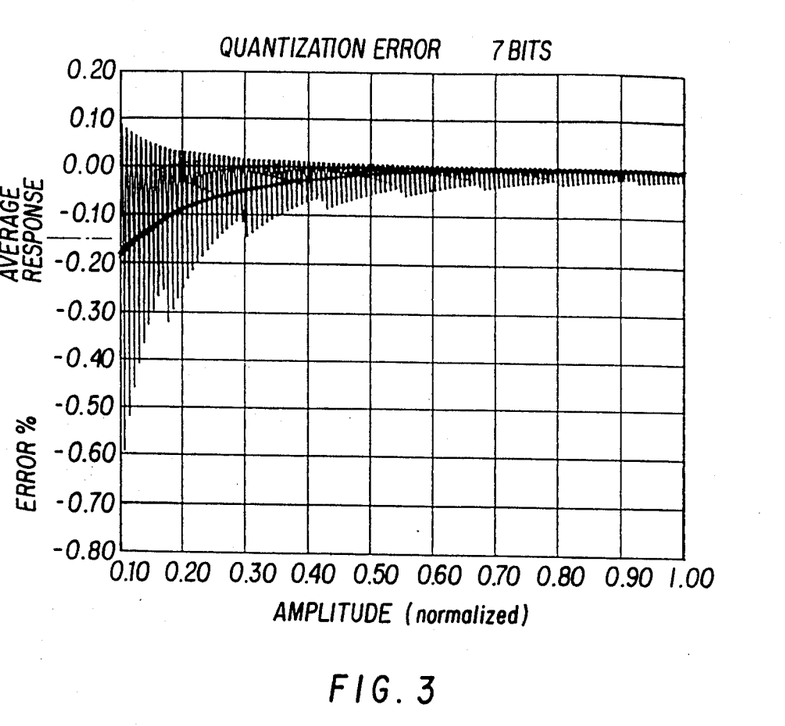
FIG. 3 is a graph showing the effect of quantization error for a 7 bit analog to digital converter.

The accuracy of an A/D converter is limited by (amongst other things), quantization error. FIG. 3 shows the effect of quantization error for a 7 bit converter. Thus it is possible to observe errors of 0.6% at about 11% of full scale amplitude. Because of this limitation it appeared that three analog ranges were necessary to cover the dynamic range of the meter. As previously discussed it was found that quantization error could be reduced in two ways:

(i) By adding a random signal to the actual signal and averaging the result, the average response of FIG. 3 could be obtained.

Figure 4:
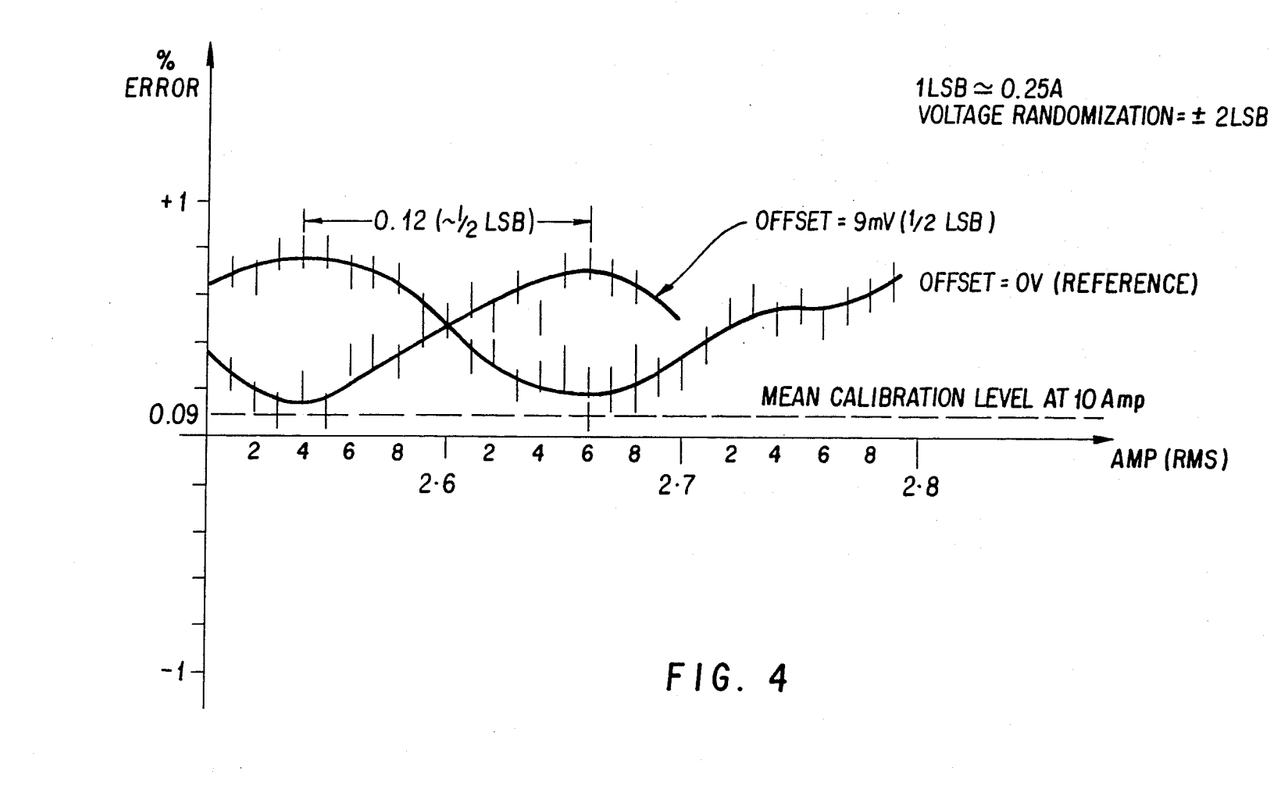
FIG. 4 is a graph showing quantization error for a 7 bit analog to digital converter using the techniques of the invention.

(ii) Experimental results showed that by adding ½ LSB offset to the input signal the whole graph of FIG. 3 was shifted horizontally by the equivalent of ½ LSB. FIG. 4 shows the experimental results. This confirmed that a simple switching of offset between two levels of ½ LSB apart would result in an average response of lower absolute error.

The overall effect of (i) and (ii) above is to "smooth out the bumps" of FIGS. 3 and 4. This enabled the use of 2 analog ranges The "bumps" of FIG. 3 were not completely eliminated due to limitations in average and level switching. However an improvement in resolution of about 3 to 4 times was observed. Field results of +0.5% Error at one tenth of the full scale amplitude imply an A/D resolution of 11 bits when in fact only 7 are used (7 positive ½ cycle, 7 for negative ½ cycle implies an 8 bit converter over all).

3. Voltage Input Circuit

Monitoring the mains voltage is done via a simple potential divider (R76, R77, R45). The reduced voltage is buffered by U6,D and then sampled by analog input AN3. All analog inputs are protected by clamp diodes to Vcc and ground.

4. Non-Volatile Memory

Calibration data, Night Rate switch times, Holiday Dates, Energy Backup Registers and Ripple Control Codes are some of the data that can be stored in the NOVRAM (non-volatile memory device U1). The data, which is kept in RAM during normal operation, is backed up to $E^2PROM$ (in the same chip) upon detection of an impending power failure. Once stored in $E^2PROM$, the data can be saved without power for periods in excess of 10 years. Communication between the microcomputer (U4) and the NOVRAM (U1) is via Ports A & C of the microcomputer.

5. Clock and Backup Circuit

For time keeping during power outages a CMOS clock device (U3), is utilized. Communication with microcomputer (U4) is again via Ports A and C. A supercap (C40) is the power supply for the clock (U3) during power outages. The use of a supercap (C40) provides substantial advantages over the conventional backup sources of lithium or Ni-Cd cells. The life expectancy of a supercap is as long as most of the components it is associated with because it does not run flat like a lithium cell and can be charged and discharged as often as required without any ill-effects as opposed to Ni-Cd cells. The basic difference between the method of back-up used in FIG. 2 and other methods of CMOS clock back-up, is that a current source rather than a voltage source is used to supply energy to the clock chip (U3). In this way the stored energy reserve is better utilized. This results in longer back-up times than would be achieved by a voltage source. Another key feature of the back-up circuit is the method by which the clock chip (U3) is "ground isolated" from the rest of the circuit. This is achieved by two transistors of transistor pack U2.

6. Keyed Input

Two push buttons (BOOST and DISPLAY) on the front of the analyzer's case (not shown) magnetically activate reed switches (S1, S2). The activation is detected by Port lines PA1 and PA2 of microcomputer (U4). The reed switches and associated circuitry are shown in area E 12 of FIG. 2.

Detection of the position of the Mode switch (S3) is done in an identical manner. The mode switch selects Normal operation mode or Set-up mode. Set-up mode is used for allowing the setting of clock data by the Display and Boost switches. Also, Set-up mode will allow communications via the optical port without the need for a password.

7. Optical Communications Link

Optical communication is facilitated by one Infrared Light Emitting Diode (Q2) and one Infrared Phototransistor (Q1). Q2 is directly controlled from microcomputer port PB4. The output of the phototransistor is directly monitored by port PD6. Timing for the serial data is derived from the timer built into microcomputer (U4).

The serial port may be used to set and read the clock/calendar (U3) and to read/write the non-volatile memory (U1). Although it is perfectly feasible to operate the analyzer without this facility, the use of a data terminal (not shown) is recommended if some of the analyzer's more sophisticated capabilities are to be exploited.

8. Contactor and Associated Protection

The contactor K1 of FIG. 2 is driven from port BØ of microcomputer U4 via transistor Q5. Maximum continuous current through the contact is 30 amp. It is required that the contactor K1 withstand 1 KA and 3 KA prospective faults and 1 KA "make" prospective fault without significant contactor damage or sticking. To achieve the required performance a special magnetic blowout device is included in series with the contacts.

Figure 5:
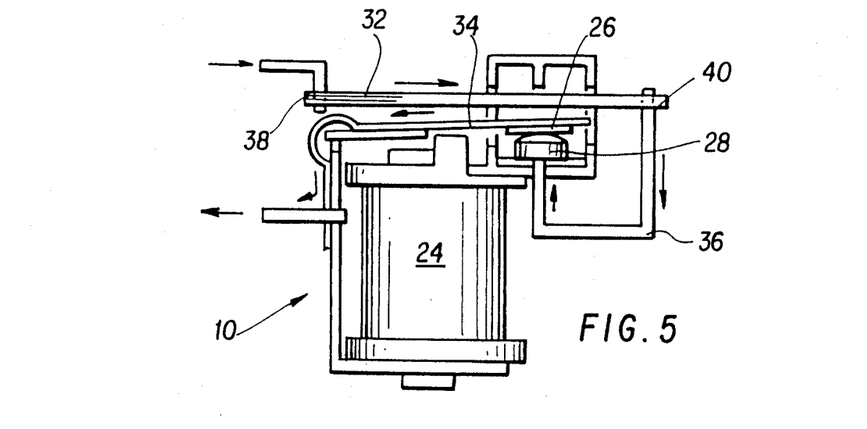
FIG. 5 is a front view of a contactor modified in accordance with the invention.
Figure 6:
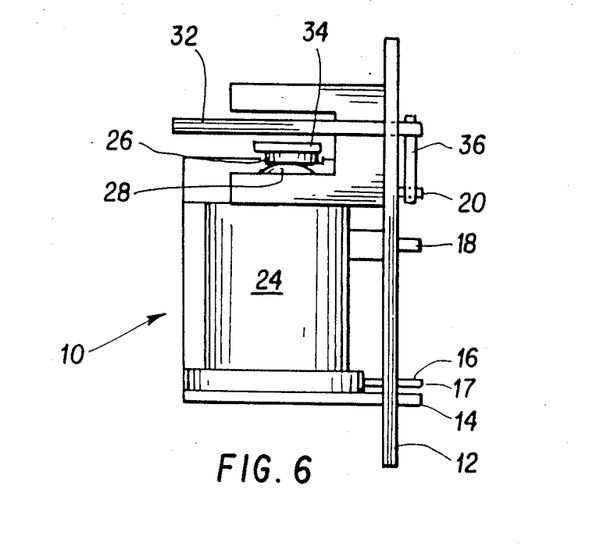
FIG. 6 is a side view of the contactor shown in FIG. 5.

A suitable contactor 10 is shown in FIGS. 5 and 6. It is rated at 30 AMP RMS continuous. However it will not withstand 1000 and 3000 Amp fault currents for as long as it takes a 16 Amp rewirable fuse or a 20 Amp HRC (3 KA) fuse to blow.

Contactor 10 is mounted on printed circuit board 12 by terminals 14,16,17,18 and 20. Terminals 16 and 17 control the current to coil 24, terminal 18 is connected to moving arm contact 26 and terminal 20 is connected to lower stationary contact 28. It was found in practice, that if the contacts 26,28 were physically jammed together then they would survive the fault current. This meant that the contacts 26,28 were being forced apart during fault tests (when there was nothing jamming the contacts). The forcing apart of the contacts was due to electromagnetic forces which were generated by the large current flow. Once the contacts are forced apart, arcing occurs and the contacts are destroyed.

In order to overcome the magnetic "blow-out" forces, a plate 32 is mounted on board 12 parallel to moving arm 34. Plate 32 has a slot (not shown) in order that it may be positioned over contactor 10. A copper track 36 on board 12 links stationary contact 28 to plate 32 by terminal 20. Plate 32 has an input terminal 38 at one end and an output terminal 40 at the other end. When contacts 26,28 are closed current flowing through the moving arm 34 flows in an opposite direction to that of plate 32, as indicated by the arrows shown in FIG. 5. Basic physics dictates that a force will be set up between the plate and the moving arm such that it will tend to force the moving arm and the plate apart. Such a force is proportional to the square of the current. The contactor survives the fault tests with the plate in place because the contacts 26,28 are forced further together under the magnetic forces generated. Accordingly no arcing occurs and the contacts are not destroyed.

9. Liquid Crystal Display (LCD) and Visible Light Emitting Diodes (LED's)

Port Lines PB3, PA7, PA6 and PB7 of microcomputer (U4) are used to control the display driver (U10) and hence the display (LCD). The microcomputer (U4) uses a serial bus communication to communicate with display (LCD). Pinouts of the custom made duplex display (DS1) were chosen to suit the pinouts of the driver (U10). In general terms, the driver (U10) is a single chip, silicon gate CMOS circuit designed to drive an LCD with up to 64 segments in a duplex manner. When the display is not in use, it is turned off by port PB7 via a transistor of U2.

DS2 and DS3 are the KWhr pulse LED and the boost LED respectively. DS2 is controlled directly from microcomputer (U4) and the Boost LED is turned on via transistor (Q5) which turns on the contactor (K1). Diode DS4 indicates the presence of ripple tones on the mains.

10. Microcomputer with A/D

The microcomputer (U4) incorporates a CPU, on-chip crystal clock, user ROM, RAM, memory mapped I/O, A/D converter and a timer. To avoid a bad reset on power up, the network (D10, VR2 and R52) holds the reset line down until the supply voltage level is sufficient to initiate an orderly reset. Upon application of sufficient mains voltage, U4 is held in reset mode for about 100 mSec by capacitor C23; when the Reset state is released, by the charging of capacitor C23, U4 initializes its RAM and does a recall from NOVRAM (U1). An Internal Crystal locked (by crystal X1, capacitor C10) timer is enabled and U4 enters normal operation.

The microcomputer tasks are divided into two types; foreground and background. Foreground tasks are interrupt driven via the internal timer. The main foreground task is the energy measuring/sampling algorithm. Background tasks (e.g. Display refresh) are done in the microcomputer's "spare time" i.e. whenever it is not in an interrupt state. Energy measurement begins with a timer interrupt which causes entry into the sampling algorithm. The voltage and current are sampled within about 5 $\mu$ sec of each other by analog inputs AN0, AN1 and AN3. Such close sampling is made possible by the sample and hold capacitors C6, C7 and C8. Voltage and Current Samples are digitized by the microcomputer's converter then multiplied and scaled to form power. Accumulation of many such instantaneous power samples over time constitutes an indication of accumulated energy flow. Comparison of the indicated energy flow with a constant known to be equivalent to one watt-hour of energy defines energy measurement. The constant referred to above is the calibration constant which is adjusted when the meter is calibrated. A more detailed description of the energy measurement algorithm will be given later in this specification.

Registers are provided in RAM (and NOVRAM U1) for accumulating the units of watt-hours detected by the above method. If Time of Use (T.O.U.) is enabled (i.e. clock is in use) then the relevant register (i.e. High, Mid or Low rate register) is incremented by one. Energy registers can be displayed upon command on display (LCD).

As an aid to calibration and for the consumer's information the LED DS2 is made to flash for every watt-hour of energy that passes through the main circuit.

Every second, the microcomputer checks the clock (U3). If it is time for a particular action to occur (e.g. turning on the contactor for the hot water supply) then that action is executed.

Power failure is detected by the microcomputer via the mains voltage analog input channel (AN3). Because of the large reservoir capacitor C36, the microcomputer has at least 25 mSec to save vital information and effect an orderly power down. All of the information that needs to be saved is kept in the RAM part of the NOVRAM (U1). This is saved by simply taking PC6 low. However power must be maintained for at least 10 mSec after taking PC6 low. As the logic supply falls, the super-capacitor storage (C40) holds the clock supply to above 2.2 V thus maintaining clock (U3) operation.

The method of energy measurement and the measurement algorithm will now be discussed.

Figure 7:
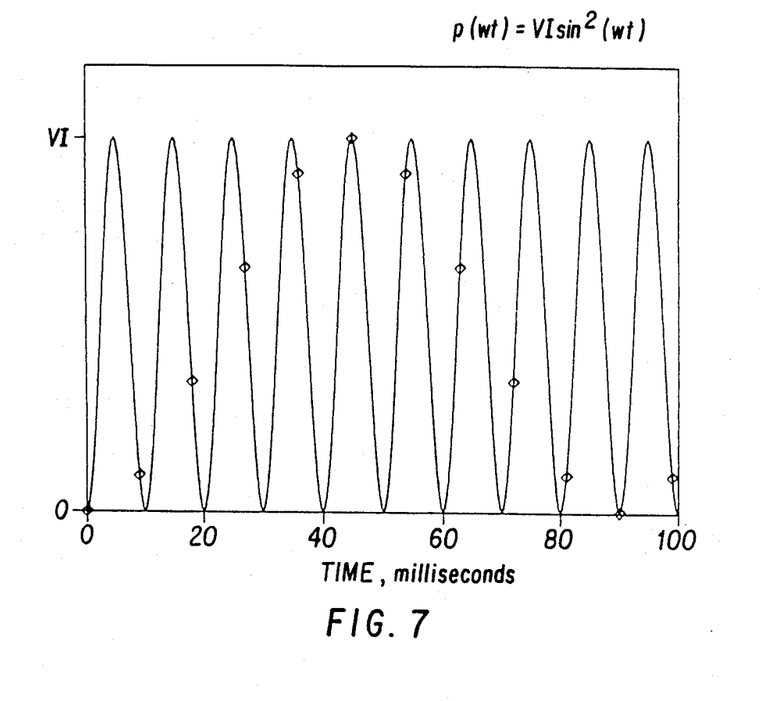
FIG. 7 is a graph of a power curve reconstructed by using the techniques of the invention.
Figure 21:
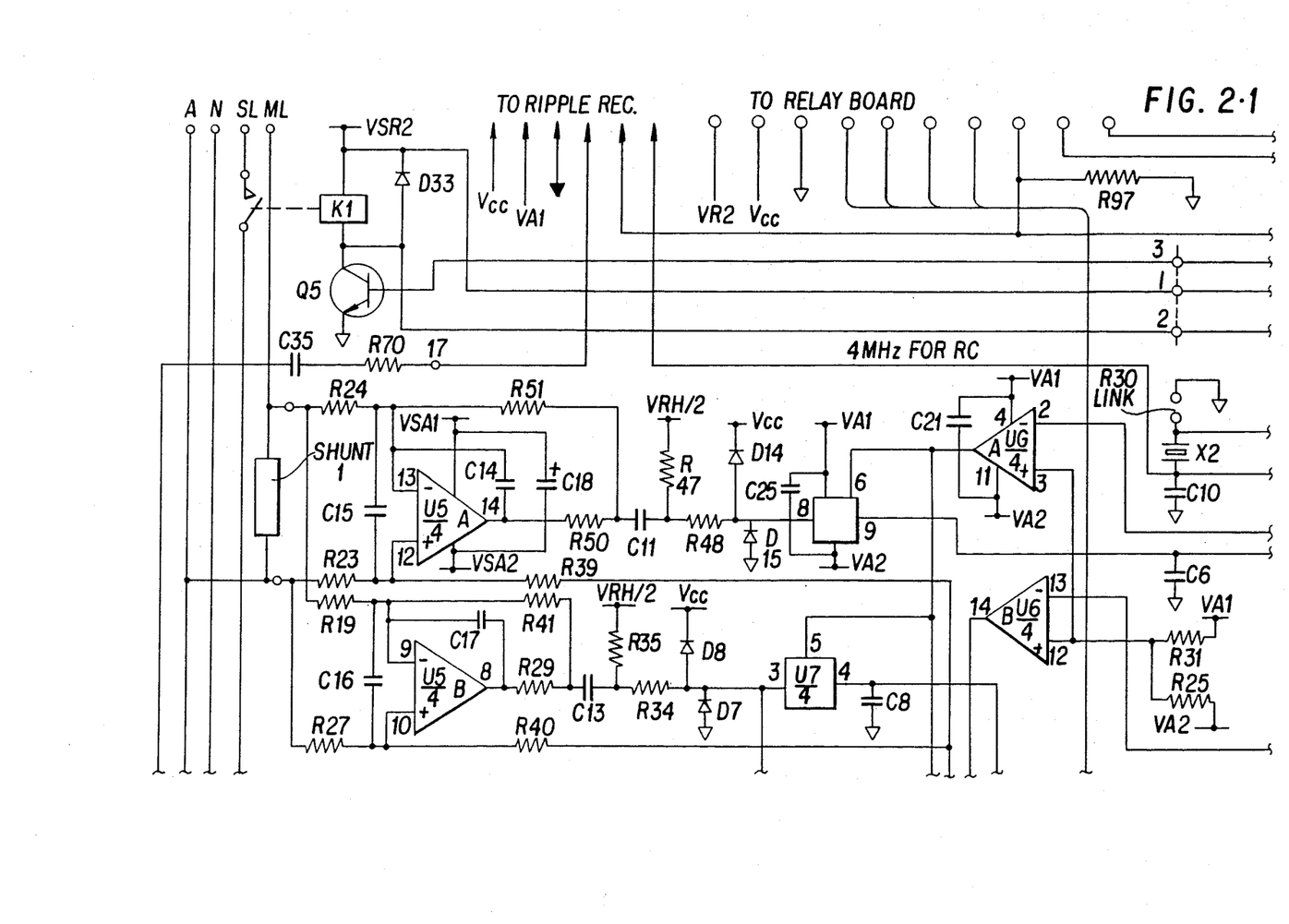
Figure 22:
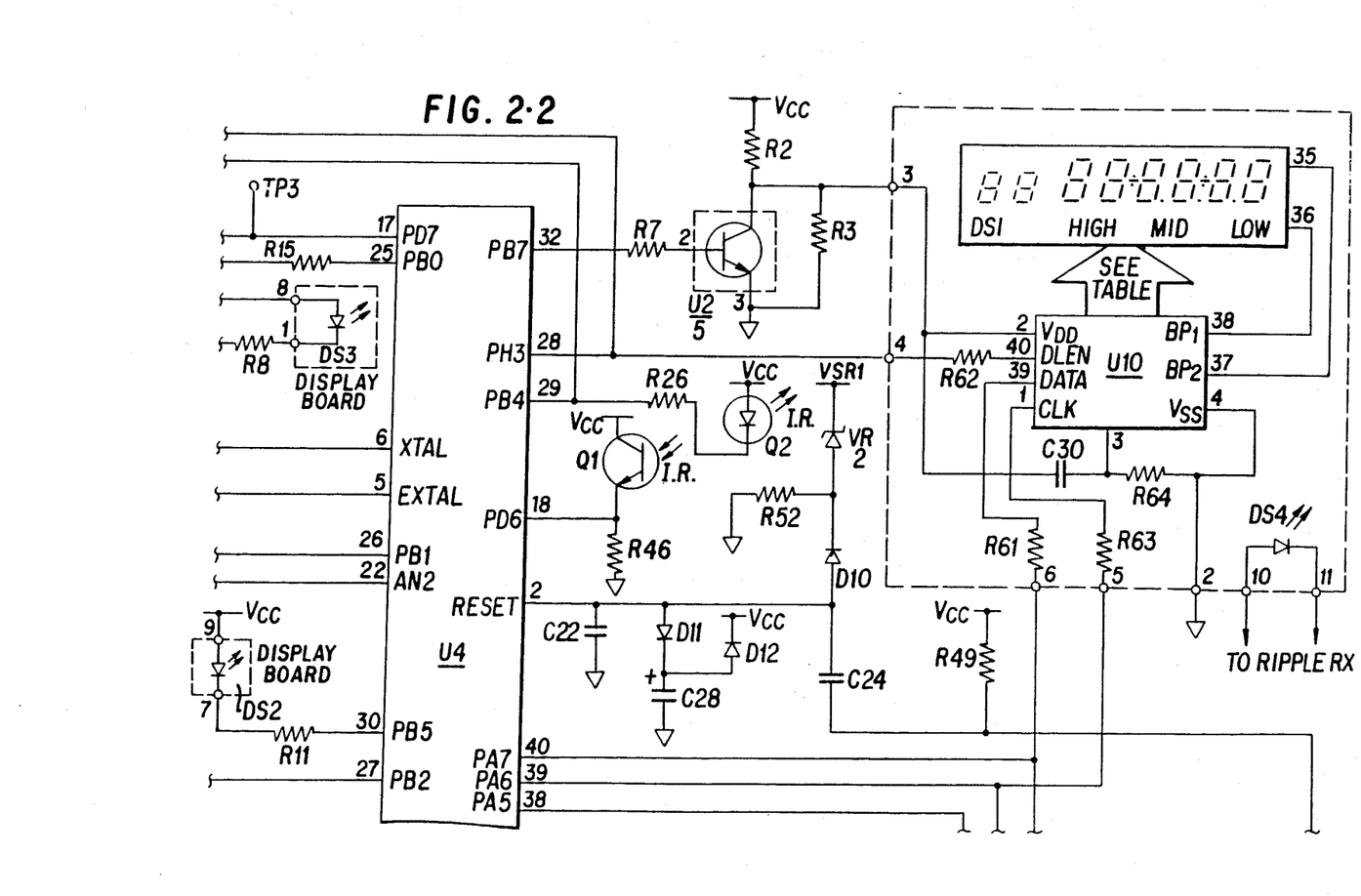
Figure 23:
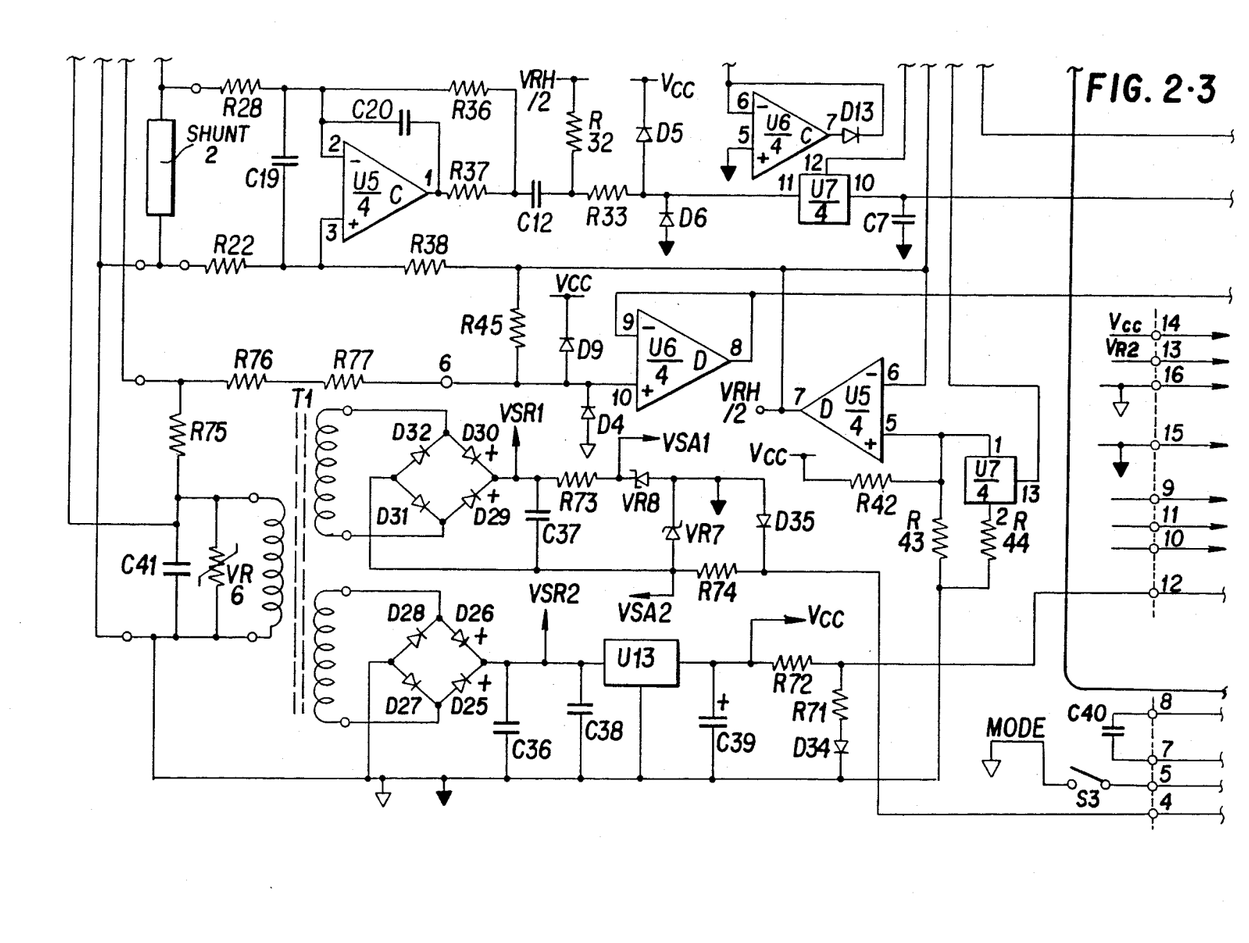
Figure 24:
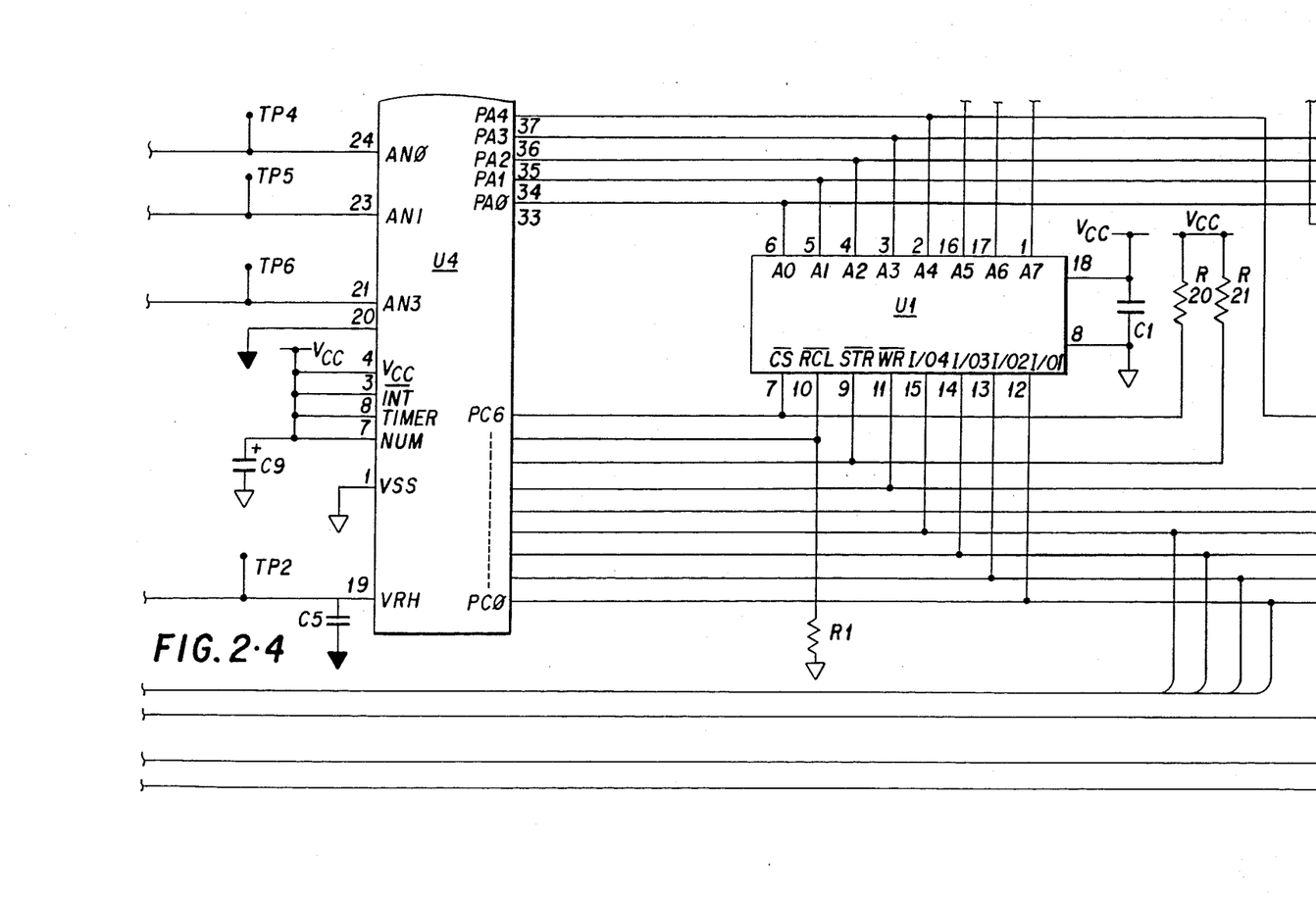
Figure 25:
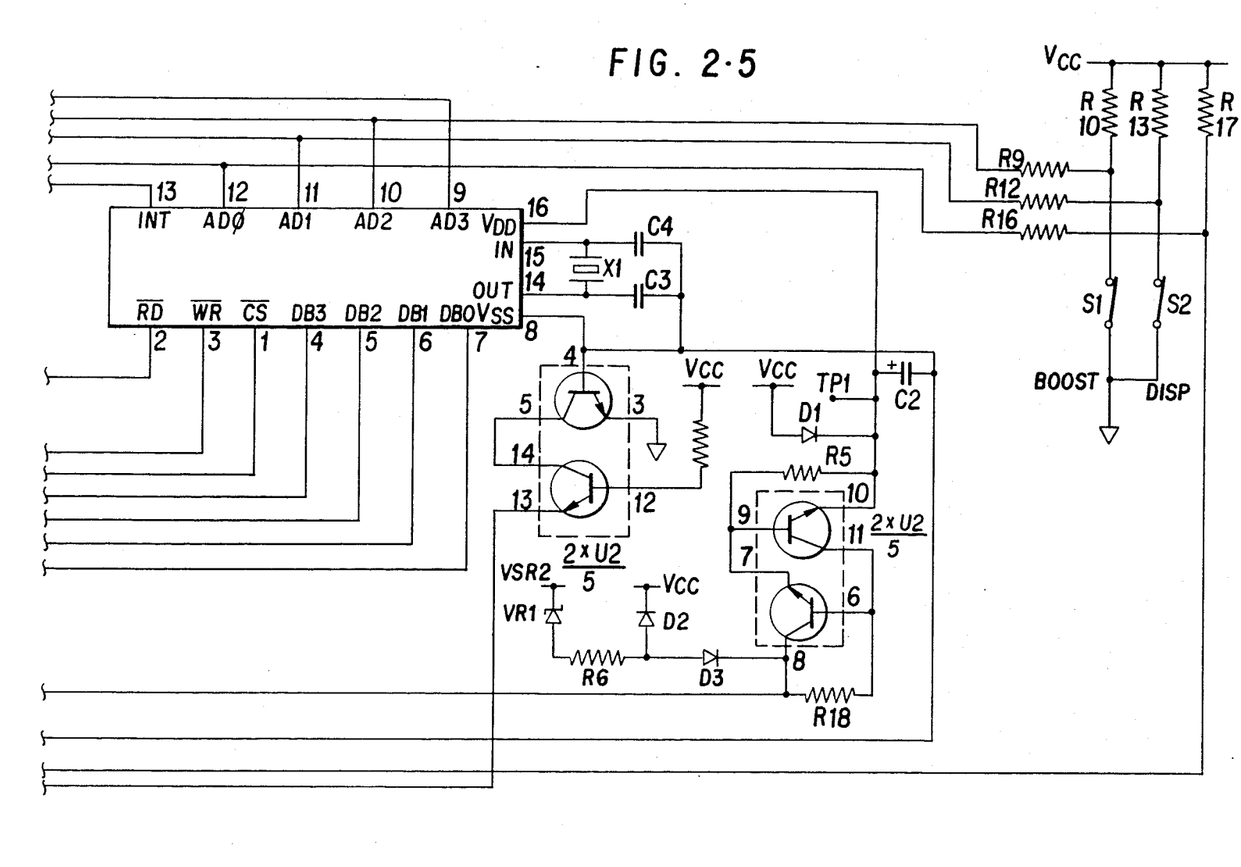

The analog input signals (AN0, AN1, AN2, AN3) are sampled at a constant frequency unrelated to the mains frequency. A sample rate was chosen such that the instantaneous power values derived represented a power curve, the same shape as the actual power curve, with area proportional to the actual curve. It is important that a sufficiently large number of power samples represent one cycle of the "reconstructed" curve, so that harmonic content is retained. FIG. 7 shows the power curve obtained for a sampling interval of 9 milliseconds. In this case, the period of the power curve is 180 mSec; (90 mSec, if voltage and current waveforms are symmetrical). This is a very short time span compared with the likely changes of the input waveforms.

Such changes could be due to the switching of appliances. The energy contained in the power curve is obtained by summing the power samples and comparing the sum with a constant each time a summation is performed. If the power sum exceeds the constant then the energy register (Watt-hour register) is incremented and the constant is subtracted from the sum. This approach has several advantages:
1. Less RAM storage is required.
2. Less arithmetic is needed as the energy registers may be in BCD arithmetic and simple increment/decrement operations are the only manipulations required.
3. The "constant" incorporates calibration adjustments, thus becoming one of the "calibration constants".

An outline of the procedure used in the analyzer is given below. The routine is executed once every 9 mSec when invoked by a timer interrupt.
1. Select AMPS input and take ADC sample.
2. Select VOLTS input and take ADC sample.
3. Convert AMPS and VOLTS to 'magnitude+sign' form.
4. Multiply VOLTS X AMPS giving POWER sample.
5. If sign of POWER=sign of POWERSUM, add POWER to POWERSUM; else subtract POWER from POWERSUM.
6. If POWERSUM>=KCAL, subtract KCAL from POWERSUM, increment ENERGY register (watt-hours).
7. Exit.

The "calibration constant", KCAL, is chosen such that the sum of power samples corresponding to one watt-hour of energy is equal to KCAL.

In practice, the basic algorithm is extended to handle more than one current range (two in the preferred embodiment previously discussed), and a second (switched) circuit (SL). Processing of the two circuits is interleaved so that in each 9 mSec interval, the routine is called twice. Multiple input ranges on the main circuit are handled by providing separate "POWERSUM" and "KCAL" registers for each current range.

The energy in the power curve is given by:

$$E = \frac{ts}{3600} * \frac{Vp.Ip}{Pmax} * P_i$$

Where
  ts=sampling interval
  $P_i$='normalized' power samples
  Pmax=value to which $P_i$ are normalized
  Vp,Ip=peak volts and amps readings at (P=Pmax)

EXAMPLE

Assume current range is approx. 0 to 100 A rms
Choose Ip=150 A (i.e. ADC gives $FF at 150 A peak input).
Choose Vp=375 V (i.e. ADC gives $FF at 375 V peak input), and $ts = 9 * 10^{-3}$ sec.
Assume power samples are rounded to 8 bits; therefore
...

Pmax=$FE=254

The calibration constant is the value of $P_i$ which yields one watt-hour of energy.

$$P = \frac{3600}{9*10^{-3}} * \frac{254}{375*150}$$

$$P = KCAL = 1806$$
$$= \$070E$$

Other ranges will yield proportional KCAL's.

As discussed in Section 4 the analyzer supports Ripple Control where timing signals are impressed on the mains to control activation of storage heating devices, normally overnight. In areas where Ripple Control is operating, the analyzer provides advantages over traditional equipment. The receiver is located inside the analyzer and shares the analyzer's power supply and microprocessor. Thus, significant cost savings and space savings are realized.

A ten bit code system is fully supported, with the exception of 'combination codes' (20 bit command sequences). Analyzers are programmable, in the field, to respond to two (2) separate "ON" commands (and their "OFF" complements), for the purpose of controlling the switched circuit load. This allows for (but is not restricted to) the implementation of "master commands"; i.e. the second channel may or may not be a "master command". Further, the "master command" standard may be disregarded, if desired, in favor of a more flexible grouping arrangement.

In addition to, or instead of, controlling the switched circuit contactor (K1), an option exists to allow the Time-of-Use rate (i.e. 'HIGH', 'MID' or 'LOW') to be selected by Ripple Control commands. A command code is assigned to each of the three tariffs. Using this technique, it would be feasible to employ different rates and switching times for different consumer areas, should this be desired.

The two switched circuit command codes are settable either in the field or using the data terminal attached to the opto port. The Time-of-Use tariff commands are settable only via the opto port.

If Ripple is configured for the switched circuit (SL), the two command codes ("ON" codes) are displayed on the LCD. These codes are entered and displayed as 3-digit hexadecimal numbers corresponding to the 10-bit binary command sequence. This has a minor disadvantage in that the channel number is not displayed directly. (The relationship between the standard channel numbers and the corresponding 10-bit codes is rather obscure.) However, the hex representation is not constrained to any standard, thus guarding against obsolescence, should the channel allocations be changed.

To complete the description the parts list for the integrated circuits shown in FIGS. 1 and 2 are as follows:
  U1: X2212D
  U2: LM3045J
  U3: MM 58274
  U4: MC 68705R5S
  U5: MC 35084AL
  U6: LM324J
  U7: MC 14066BCL
  U10: PCF2111
  U13: LM 309KC It is believed that the invention and many of its attendant advantages will be understood from the foregoing description and it will be apparent that various changes may be made in the form, construction and arrangement of the parts and that changes may be made in the form, construction and arrangement of the electrical energy analyzer described without departing from the spirit and scope of the invention or sacrificing all of its material advantages, the form hereinbefore described being merely a preferred embodiment thereof.

We claim:

1. An electrical energy analyzer including at least one current sensing means, a voltage sensing means, at least one analog to digital converter responsive to a measurement signal for digitizing sensed voltage and current values, computing means for constantly monitoring electrical energy consumption based on said digitized current and voltage values, data storage means for holding calculated and other required data, and display means for displaying selected data, wherein each current sensing means includes a shunt, the voltage across which is amplified and fed to an analog switch for processing by said at least one analog to digital converter; and wherein each shunt voltage is amplified using a differential amplifier which has a square wave switched offset signal applied to the non-inverting input of said differential amplifier, said square wave having an offset of $\frac{1}{2}$ LSB and wherein the amplified signal from each said differential amplifier has limited filtering to allow a random signal to be applied to the measurement signal entering said at least one analog to digital converter.

2. The electrical energy analyzer as claimed in claim 1 wherein the measurement signal is left with $\frac{1}{2}$ to 1 LSB of superimposed random noise applied thereto.

3. The electrical energy analyzer as claimed in claim 1, wherein said analyzer includes two current sensing means for monitoring two separate electricity lines, one of said electricity lines being switched by said computing means.

4. The electrical energy analyzer as claimed in claim 3, wherein said computing means is coupled to a real time clock with said computing means switching said one line dependent on the time of day or else upon ripple control command.

5. The electrical energy analyzer as claimed in claim 4, wherein said data storage means stores the energy consumed within a plurality of time of day zones.

* * * * *